United States Patent [19]
Khorramabadi et al.

[11] Patent Number: 5,982,228
[45] Date of Patent: Nov. 9, 1999

[54] FREQUENCY TUNING APPARATUS AND METHOD FOR CONTINUOUS-TIME FILTERS

[75] Inventors: Haideh Khorramabadi, Chatham Township, Morris County; Maurice J. Tarsia, Colonia; Nam Sung Woo, New Providence, all of N.J.

[73] Assignee: Lucent Technologies Inc, Murray Hill, N.J.

[21] Appl. No.: 08/502,591

[22] Filed: Jul. 14, 1995

[51] Int. Cl.[6] .................................................. H04B 1/16
[52] U.S. Cl. ..................... 327/553; 327/552; 327/557; 327/558; 327/559; 330/305
[58] Field of Search ..................... 327/551, 552, 327/553, 554, 555, 556, 557; 330/305

[56] References Cited

U.S. PATENT DOCUMENTS

| | | | |
|---|---|---|---|
| 4,544,911 | 10/1985 | Altman et al. | 455/179 |
| 5,101,509 | 3/1992 | Lai | 455/183 |
| 5,392,171 | 2/1995 | Kovner et al. | 360/65 |
| 5,392,456 | 2/1995 | Mitomo et al. | 455/38.3 |
| 5,396,375 | 3/1995 | Nagase et al. | 360/46 |
| 5,408,196 | 4/1995 | Sempel et al. | 329/325 |
| 5,507,293 | 4/1996 | Tannaka et al. | 128/661.01 |

FOREIGN PATENT DOCUMENTS 0157598  10/1985  Japan ...................................... 327/167

OTHER PUBLICATIONS

Khen–Sang Tan and Paul R. Gray, "Fully Integrated Analog Filters Using Bipolar–JFET Technology" Dec. 1978, IEEE Journal of Solid–State Circuits, vol. SC–13, No. 6.
"Application of Yig Devices", John F. McCole, "Microwave", Sep. 1965.

*Primary Examiner*—Timothy P. Callahan
*Assistant Examiner*—Dinh T. Le
*Attorney, Agent, or Firm*—Walter J. Tencza, Jr.

[57] ABSTRACT

The present invention provides an apparatus and method of tuning the frequency characteristics of a continuous-time filter. First and second test signals are provided to a filter means and the respective first and second responses of the filter means are measured. The first and second responses are compared and based on the comparison a tuning control signal is provided to the filter means to tune the frequency response characteristics of the filter means. During a tuning phase of operation, a first switch connects a test signal generator and disconnects a data signal generator from the transmission input of a continuous-time filter. A signal processor receives a signal from the transmission output from the continuous-time filter and produces a tuning control signal based on that signal. The test signal generator is comprised of means for providing a first test signal, which may be an alternating signal source ("A.C."), and means for providing a second test signal, which may be a direct signal source ("D.C."). The signal processor compares the signal from the transmission output of the filter during a direct signal phase with the signal from the transmission output of the filter during an alternating signal phase and produces the tuning control signal based on the comparison.

54 Claims, 9 Drawing Sheets ns apparatus and
method for continuous-time
filters

FIELD OF THE INVENTION

This invention relates to the field of frequency tuning of continuous-time filters.

BACKGROUND OF THE INVENTION

Frequency response characteristics of continuous-time filters depend on absolute values of capacitors and resistors or transconductances in the filters. The absolute values of these components in the monolithic integrated form tend to be highly variable. Because of this variability, tuning is often necessary to control the frequency response characteristics of continuous-time filters.

Various techniques are currently known for tuning the frequency response of continuous-time or analog filters. One of these methods is disclosed in "Fully Integrated Analog Filters Using Bipolar-JFET Technology" IEEE Journal of Solid-State Circuits, pp. 814–821, Vol., SC-13, No. 6, December 1978. It employs a real-time master-slave approach and involves the use of a phase-locked loop as shown in FIG. 7 of that reference on p. 817. However, that method is not effective for applications such as radio frequency receivers and portable wireless devices because it requires a significant amount of hardware and power dissipation. In addition, that method provides limited dynamic range for the filter because of the parasitic feed through of the reference signal during normal data transmission.

Another known solution to the problem of variability of filter component values is manual trimming. Manual trimming is unattractive because it requires additional manufacturing cost and it typically does not compensate for component aging.

SUMMARY OF THE INVENTION

The present invention provides an apparatus and method of tuning the frequency characteristics of a filter, which is preferably a continuous-time filter. First and second test signals are provided to a filter means and the respective first and second responses of the filter means are measured. The first and second responses are compared to each other. Based on the comparison a tuning control signal is provided to the filter means to tune the frequency response characteristics of the filter means. Advantageously, a single test signal can be used to tune the filter means during an "off-line" state when a data signal generator is disconnected from the filter.

The present invention can advantageously be deployed in wireless and portable communications devices, such as cellular telephones, in which analog to digital converters and controllers such as digital signal processors are already part of the system. A minimal amount of hardware is required to implement the preferred form of the invention in such devices. In its "off-line" form the present invention also overcomes the prior art problem of limitations in dynamic range. Other objects and advantages of the present invention will become apparent to those skilled in the art from the remainder of the specification.

DETAILED DESCRIPTION OF THE DRAWINGS INTRODUCTION

Figure 1:
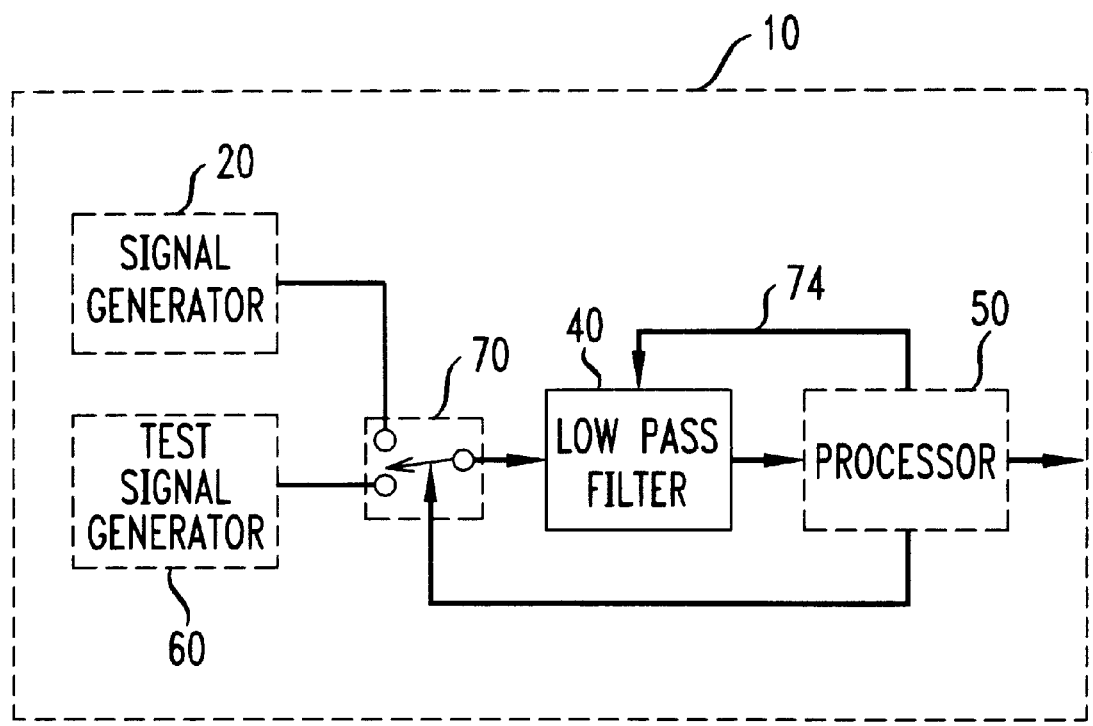
FIG. 1 is a block diagram of a circuit incorporating the off-line filter tuning technique of the present invention.

The first and second test signals may be provided by a test signal generator. In one form of the invention, an "off-line" tuning technique is performed by disconnecting a data signal generator and connecting the test signal generator to a transmission input of a filter. The term "generator" is used in a broad sense, and includes devices such as conventional radio receivers which "generate" a signal by receiving it in a wireless manner from a source.

In one embodiment a circuit comprising a test signal generator, a data signal generator, a continuous-time filter, a first switch, and a signal processor is provided. To initiate a tuning phase, the first switch connects the test signal generator and disconnects the data signal generator from a transmission input of the continuous-time filter. The signal processor produces a tuning control signal based on a signal from a transmission output of the continuous-time filter during the tuning phase. The tuning control signal is applied to the filter to change its frequency response characteristics. Preferably, the tuning control signal is stored in a memory device which is part of the filter. During a data phase of operation, the tuning control signal is applied to the filter. Normal data transmission is resumed when the first switch disconnects the test signal generator and connects the data signal generator to the transmission input of the filter.

The test signal generator is preferably comprised of means for providing a first test signal, which can be an alternating signal source, and means for providing a second test signal, which can be a direct signal source. In one form of the invention a second switch is provided for switching between the two sources. The signal processor compares a signal from the transmission output of the filter produced during a direct signal phase with a signal from the transmission output of the filter produced during an alternating signal phase and produces the tuning control signal based on the comparison. The signal processor preferably employs an analog to digital converter and a controller, to compare the two filter transmission output signals. The controller can be a digital signal processor, a microcontroller, a microprocessor, or digital circuitry comprising combinational and sequential circuit elements. In one embodiment the average power of a signal during the direct signal phase is compared with the average power of a signal during the alternating signal phase.

The continuous-time filter can be comprised of a variable capacitance circuit or a variable resistor circuit or a variable transconductance circuit or any combination of capacitance, resistance, and transconductance which at least partly determines the frequency response characteristics of the filter. In embodiments disclosed herein, a variable capacitance circuit scheme is employed. The variable capacitance circuit is controlled by the tuning control signal. The tuning control signal is preferably a digital signal which switches a given capacitance value into the filter circuit.

As used in the present application the term "connecting" is not limited to electrical connections through conductors and includes wireless operative connections between terminals or devices.

EMBODIMENTS

FIG. 1 is a block diagram of a circuit 10 which incorporates an off-line filter tuning technique in accordance with the present invention. Circuit 10 includes a data signal generator 20, a low pass filter 40, a signal processor 50, a test signal generator 60, and a switch 70.

During data transmission, the signal processor 50 connects the data signal generator 20 to a transmission input of the low pass filter 40 by supplying a first control signal to the switch 70. While the data signal generator 20 is connected to the filter 40, the test signal generator 60 is disconnected.

To tune the low pass filter 40, the signal processor 50 disconnects the output of the data signal generator 20 and simultaneously connects the output of the test signal generator 60 to the transmission input of the filter 40 by supplying a second control signal to switch 70. A signal at the transmission output of the low pass filter 40 during the tuning operation is used by the signal processor 50 to determine an appropriate tuning control signal. The signal processor 50 applies the tuning control signal to the control input of the low pass filter 40, through control bus 74, and thereby changes the tuning frequency of the filter 40. After tuning is complete, the signal processor 50 applies an appropriate control signal to switch 70 to cause resumption of data transmission.

Figure 2:
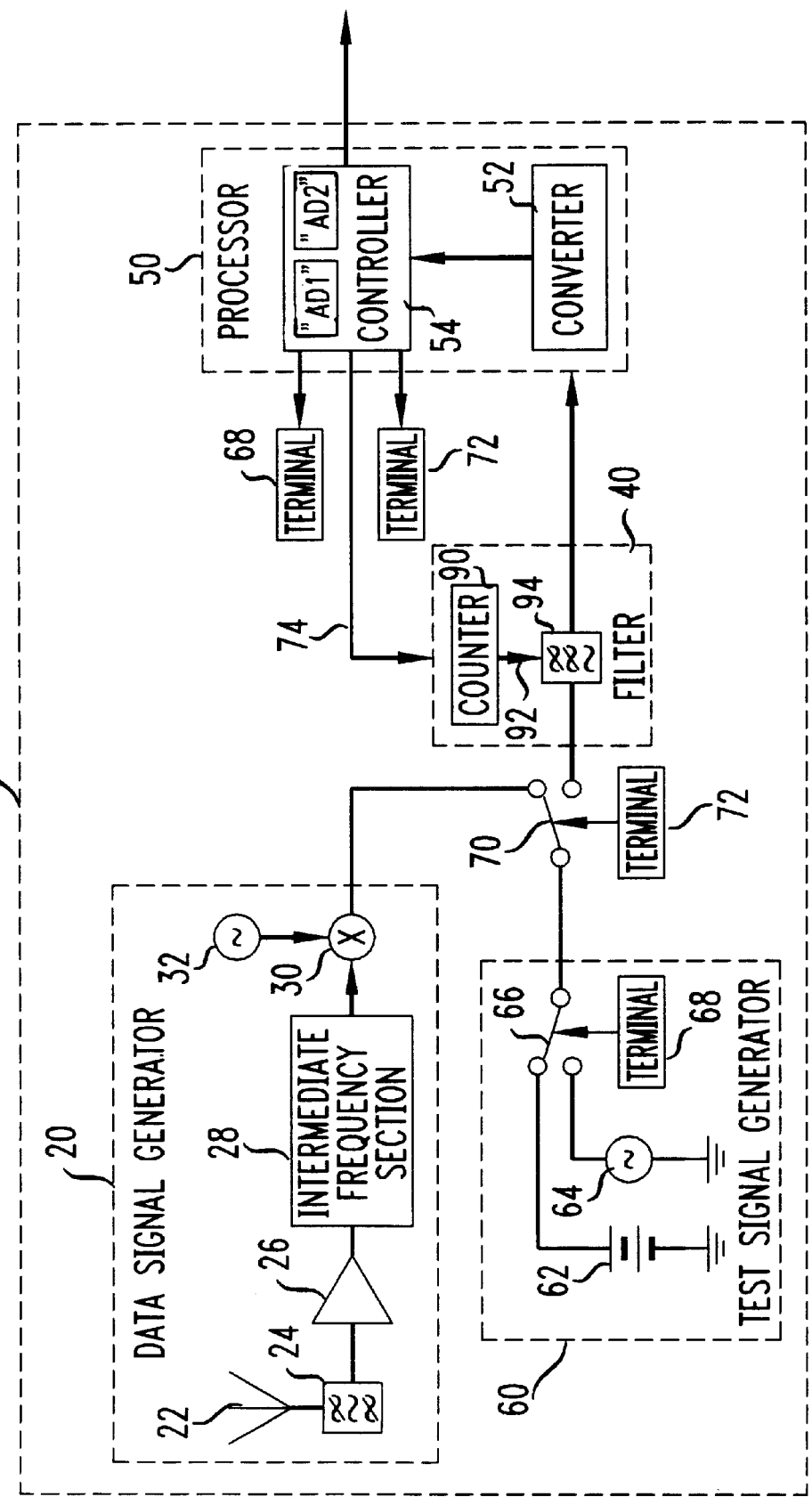
FIG. 2 is a more detailed schematic diagram of the circuit shown in FIG. 1.

FIG. 2 illustrates a detailed implementation of the circuit 10 shown in FIG. 1. Data signal generator 20 shown in FIG. 2 is the front end of a radio receiver, which includes an antenna 22 whose output is connected to the input of a bandpass filter 24. The output of the bandpass filter 24 is connected to the input of an amplifier 26 whose output is connected to the input of an intermediate frequency section 28. The intermediate frequency section 28 has an output connected to an input of mixer 30. The mixer 30 has another input connected to local oscillator 32. The filter 40 includes a counter 90 for storing a tuning control signal and a filter portion 94.

Although the tuning process is only described with reference to filter 40, it can be applied to any number of further filters, each of which may be a low pass, high pass or band pass filter. Signal processor 50 includes an analog to digital converter 52 whose output is connected to the input of a controller 54. Test signal generator 60 includes a direct signal ("D.C.") source 62, an alternating signal ("A.C.") source 64, and a switch 66. Switch 70 is provided as in FIG. 1. The controller 54 controls switches 66 and 70 through terminals 68 and 72 respectively. The controller 54 has a control bus 74 connected to the control input of the filter 40. The control input of the filter 40 is connected to counter 90 which supplies a multi-bit signal via control bus 92 to filter portion 94.

Data transmission in the circuit 10, shown in FIG. 2, occurs as follows. Antenna 22 receives a raw data signal, which is then filtered by bandpass filter 24. The modified data signal is amplified and further processed by amplifier 26 and intermediate frequency section 28. Intermediate frequency section 28 is an optional component, which may be comprised of one or more stages which gradually lower the frequency. Finally, the modified data signal is mixed by a sinusoidal signal from local oscillator 32 in mixer 30.

During data transmission, the final data signal is supplied by mixer 30, to the transmission input of low pass filter 40. The signal or signals at the transmission output of the low pass filter 40 during this data phase of operation are converted by analog to digital converter 52 and supplied to the controller 54. The controller 54 may further modify the data signals and supply the data signals to other circuits.

Figure 3:
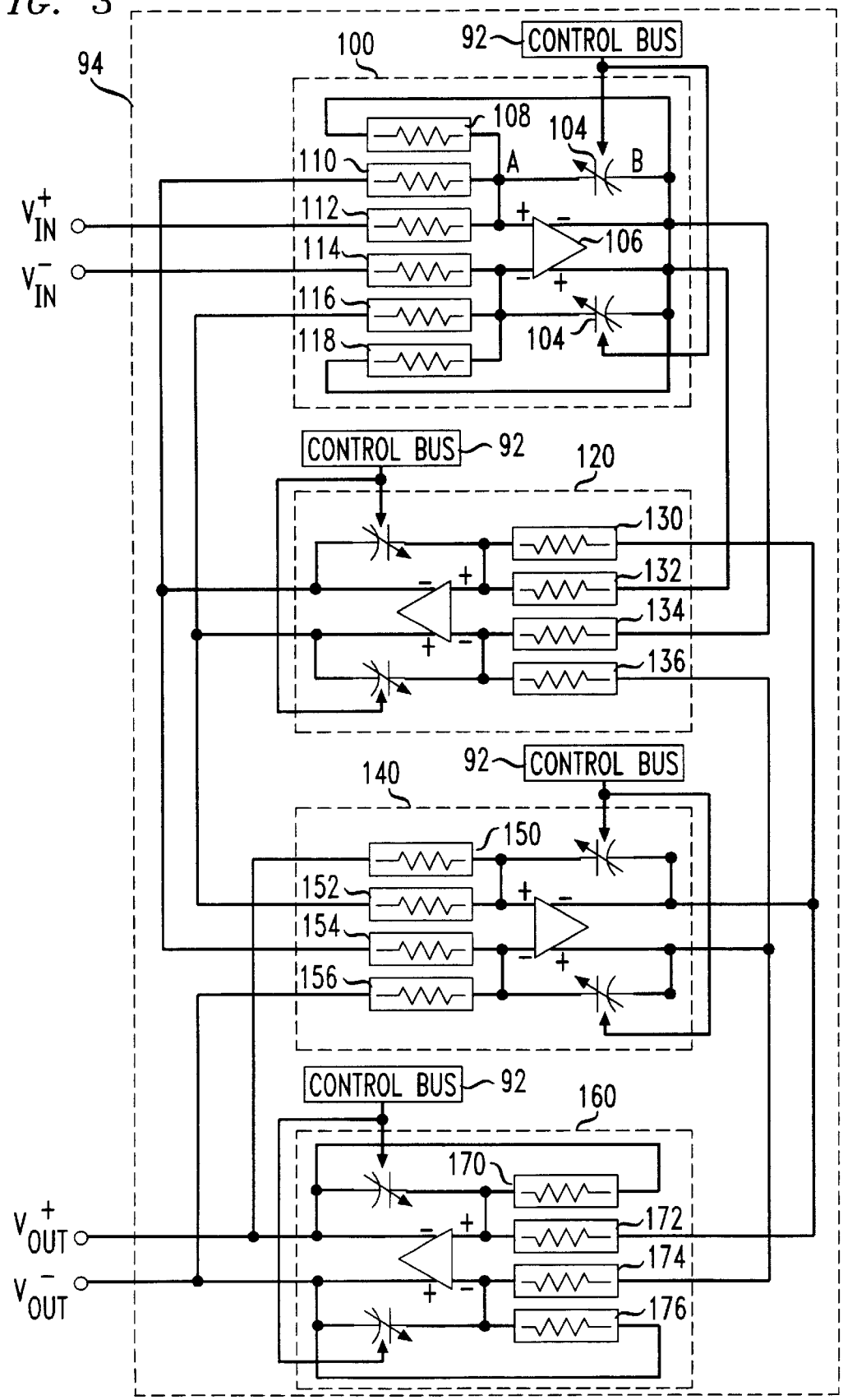
FIG. 3 is a schematic of a continuous-time filter shown in FIG. 2.
Figure 4:
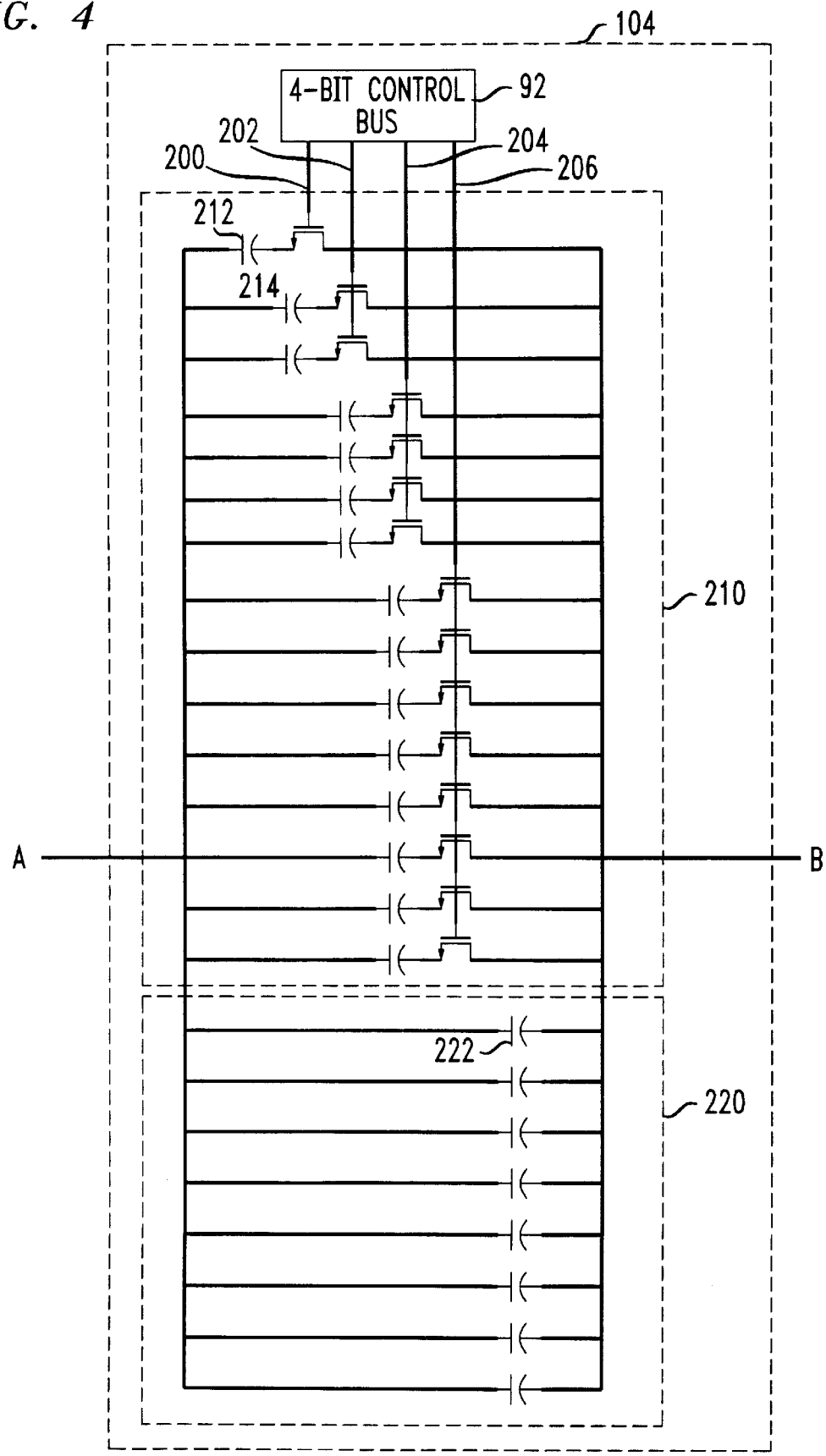
FIG. 4 is a schematic of the variable capacitor used in the continuous-time filter in FIG. 3.

In order to explain the tuning operation of the filter 40 of the circuit 10 in FIG. 2, FIGS. 3 and 4 must first be explained. FIG. 3 shows a detailed schematic of the filter portion 94 of the filter 40 and FIG. 4 shows a schematic of a variable capacitor 104 to be used in the filter 40.

Filter portion 94 of the filter 40, shown in FIG. 3, is a fourth order low pass filter comprised of four stages, 100, 120, 140, and 160. Each stage is substantially in the form of an integrator. Stage 100 includes input resistors 112 and 114, input resistors 110 and 116, and feedback resistors 108 and 118. The stage 100 also includes two variable capacitors 104 each of which is connected to the 4-bit control bus 92 of the counter 90 in FIG. 2. A fully differential amplifier 106 is also provided.

Stage 120 includes input resistors 132 and 134 and input resistors 130 and 136. Stage 140 includes input resistors 152 and 154 and input resistors 150 and 156. Stage 160 includes input resistors 172 and 174 and input resistors 170 and 176. The resistors and the capacitors 104 in the stages 100, 120, 140, and 160 should all be laid out closely together so that if they vary they will track each other. Each stage contains two variable capacitors 104 both of which are connected to the 4-bit control bus 92 of the counter 90. Each stage also includes a fully differential amplifier 106. Although the stages 100, 120, 140, and 160 are shown as having the same variable capacitor 104, each stage may have a different variable capacitor. If different variable capacitors are used, they may have values which are multiples of one another.

Variable capacitor 104, illustrated in FIG. 4., includes a variable capacitance circuit 210 connected in parallel with a fixed capacitance circuit 220. The ratio of the fixed capacitance circuit 220 to the variable capacitance circuit 210 is based on the expected variability of components.

The variable capacitance circuit 210 includes fifteen transistors 214, each of which is connected in series with a capacitor 212. The transistors are preferably MOSFETs (metal oxide semiconductor field effect transistors). The fifteen transistor-capacitor pairs are connected in parallel with each other.

The gates of the transistors 214 are connected in the following manner to the four output lines 200, 202, 204, and 206 of the 4-bit control bus 92 of the counter 90. The gate of one transistor 214 is connected to output line 200. The gates of two transistors 214 are connected to output line 202. The gates of four transistors 214 are connected to output line 204. The gates of eight transistors 214 are connected to output line 206.

When output line 200 is high, one transistor 214 is switched on and its corresponding capacitor 212 appears across the nodes A and B shown in FIGS. 3 and 4. Similarly when output line 202 is high, two transistors 214 are switched on and their two corresponding capacitors 212 appear across nodes A and B. Output lines 204 and 206 switch four and eight transistors 214 on respectively, and a corresponding four and eight capacitors 212 appear across nodes A and B. Thus a four bit control signal appearing on output lines 200, 202, 204, 206 of control output bus 92, controls the amount of capacitance appearing across nodes A and B of variable capacitor 104 in a binary fashion. The most significant bit of the 4 bit control signal appearing on control bus 92 would appear on line 206 and the least significant on line 200.

Figure 5A:
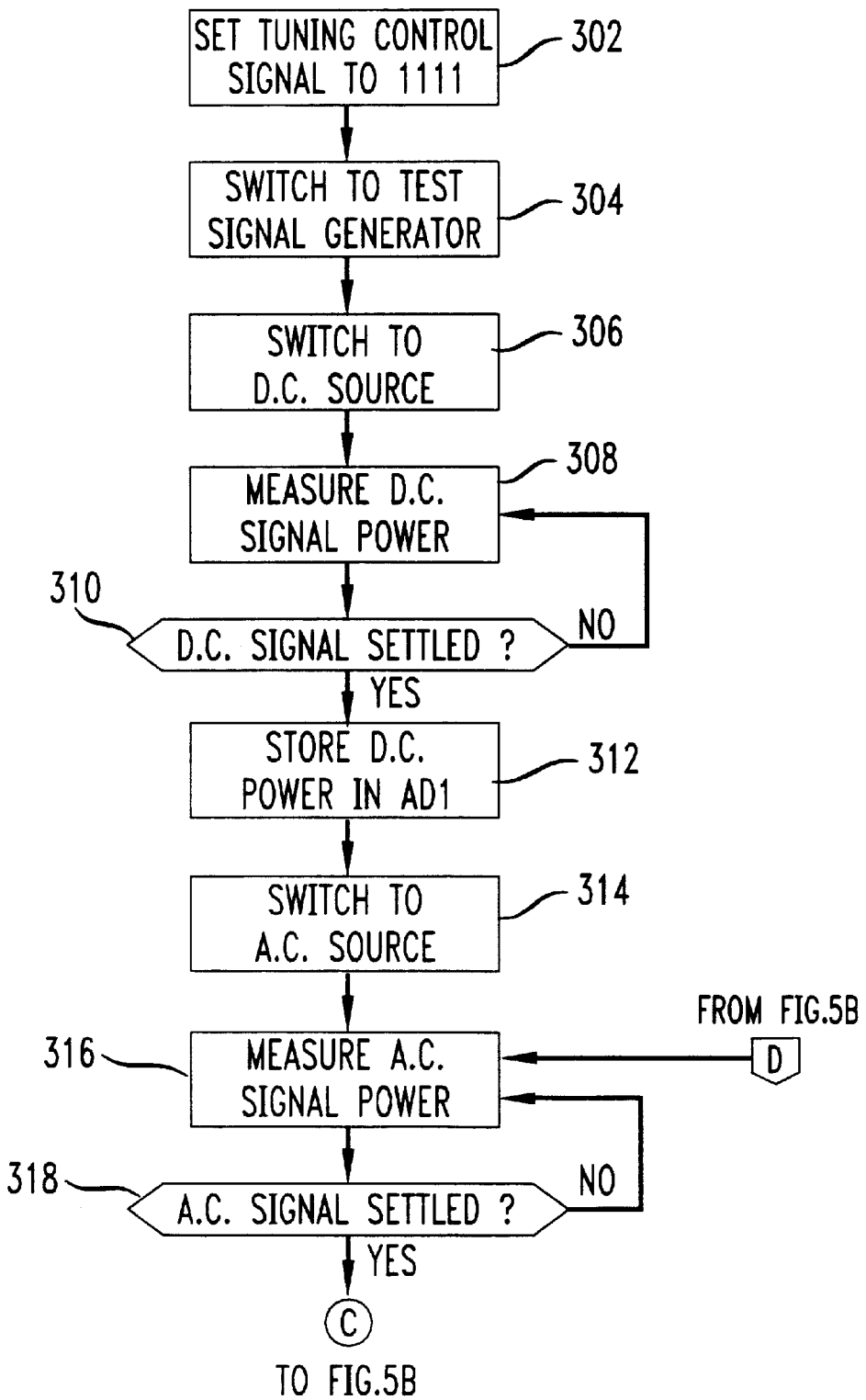
FIGS. 5A and 5B together show a flow chart of the tuning operation of the present invention for use with the circuit shown in FIGS. 2–4.
Figure 5B:
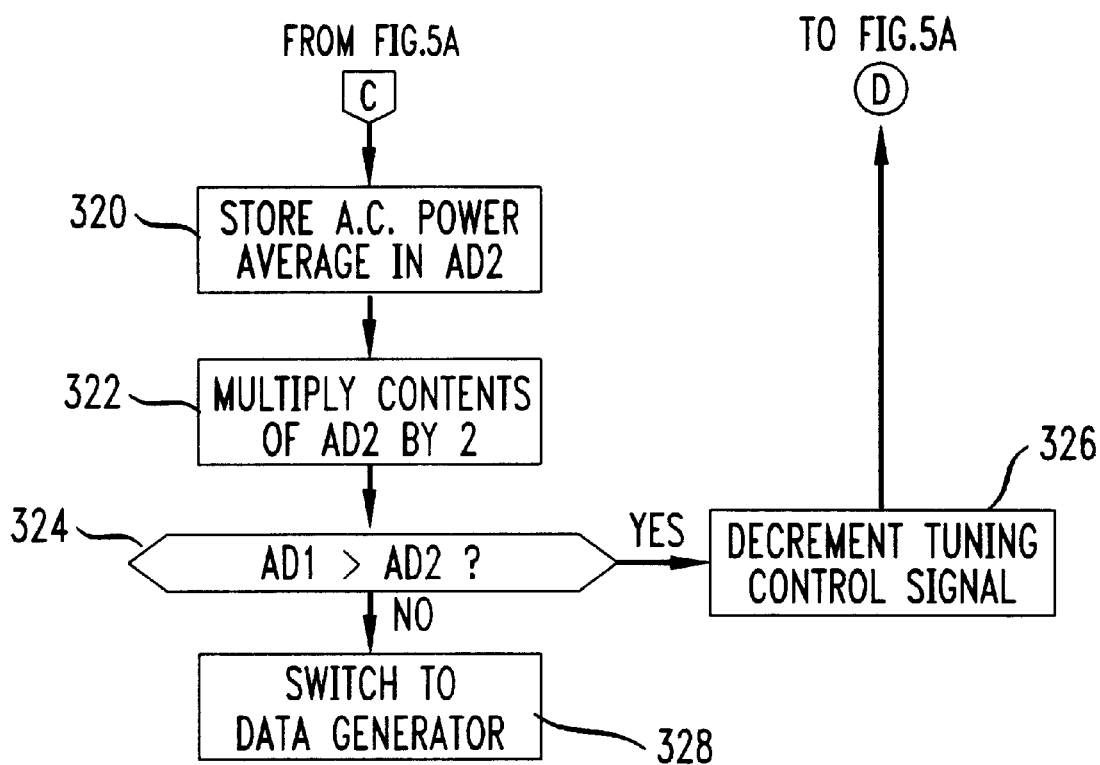

Tuning of the filter 40 of FIG. 2 occurs as shown in the flow chart 300 of FIGS. 5A and 5B. At step 302, the controller 54 initializes the tuning control signal in the counter 90 which subsequently appears on the four-bit control bus 92, to all binary ones (1111). The controller 54 may simply send a preset signal to the counter 90 to set it to all binary 1's. The controller 54 may also merely send an increment or decrement control signal to the counter 90 to change the tuning control signal stored therein. The tuning operation thus starts with all the capacitors 212 appearing across the nodes A and B of all the variable capacitors 104 in FIG. 3, so that the narrowest possible bandwidth is provided. Next, at step 304, the controller 54 sends a control signal to terminal 72 in FIG. 2, which causes switch 70 to disconnect the output of data signal generator 20 and mixer 30 and to connect the output of test signal generator 60 to the transmission input of low pass filter 40. At step 306, controller 54 sends a control signal to terminal 68 which causes switch 66 to connect D.C. source 62 and to disconnect A.C. source 64 from the low pass filter 40. The connection of the D.C. source 62 of the test signal generator 60 to the transmission input of the low pass filter 40 begins the D.C phase of the tuning operation. At step 308 the D.C. signal power is measured by the controller 54. The controller 54 determines whether the D.C. signal is settled at step 310. If the D.C. signal has not settled the controller 54 measures the D.C. signal power again at step 308, until it has settled.

Note that since the filter 40 has a finite time constant, it will take some time for the output to be fully settled. Thus, after each measurement the controller 54 will check whether the output of the filter 40 is stable. This is accomplished by comparing the power level of two consecutive sets of measurements of the output from the filter 40. The comparison is repeated until the difference between the final measured power level and the previous measured power level is within a certain boundary. This boundary is set based on the required accuracy.

If the D.C. signal has settled, the analog to digital converter 52 and the controller 54 examine the signal from the transmission output of the low pass filter 40 during this D.C. phase and a initial D.C. value is produced and stored in register AD1. The initial D.C. value is also squared in step 312 to obtain a D.C. power value which replaces the initial D.C. value in register AD1 of the controller 54 at step 312.

At step 314, the controller 54 disconnects the D.C. source 62 and connects the A.C. source 64 in FIG. 2, by sending a control signal to terminal 68 and switch 66.

The signal produced at the transmission output of the filter 40 during the A.C source phase, is sampled by the controller 54 through the analog to digital converter 52. At step 316, the A.C. signal power is measured and at step 318 it is determined from this measurement whether the A.C. signal has settled. Here, again, as in the D.C. case, the controller 54 repeats the measurement until the output is settled.

If the output of the filter 40 has settled, the controller continues on to step 320. At step 320, in one form of the invention, sixteen samples of the signal at the transmission output of the filter 40 are converted from analog to digital by converter 52 and sent to controller 54. The controller 54 squares each sample to obtain power values for each sample. These sample power values are summed together to obtain an A.C. average power value. The A.C. average power value is stored in register AD2 at step 320. The contents of AD2 are multiplied by two at step 322.

The tuning phase is designed to set a tuning control signal which will make the average power value for the A.C. source 64 output of the filter 40 equal to half the power value for the D.C. source 62 output of the filter. This will occur when the A.C. source 64 frequency has become the −3 Decibel frequency of the filter 40.

If, at step 324, the D.C. power value in AD1 is greater than the A.C. average power value multiplied by two in register AD2, the controller 54 decrements the tuning control signal at step 326 by sending a decrement control signal to the counter 90 in filter 40. If for example, this is the first time through the tuning loop, the value of the tuning control signal would now be binary 1110. Line 206 of the counter output bus 92 is the most significant bit and line 200 of the counter output bus 92 is the least significant bit. Thus a tuning control signal of binary 1110, turns off the least significant output line, 200, of counter bus 92 in FIG. 4, and takes one capacitor 214 out of the variable capacitance circuit 210.

When the appropriate tuning control signal is found so that the final value in register AD1 due to the D.C. source 62 is not greater than the final value in register AD2 due to A.C. source 64, the tuning cycle is complete. At step 328, with the tuning phase now complete, the controller 54 sends a control signal to terminal 72 causing switch 70 to disconnect the test signal generator 60 and connect the data signal generator 20 to the transmission input of the low pass filter 40.

Figure 6:
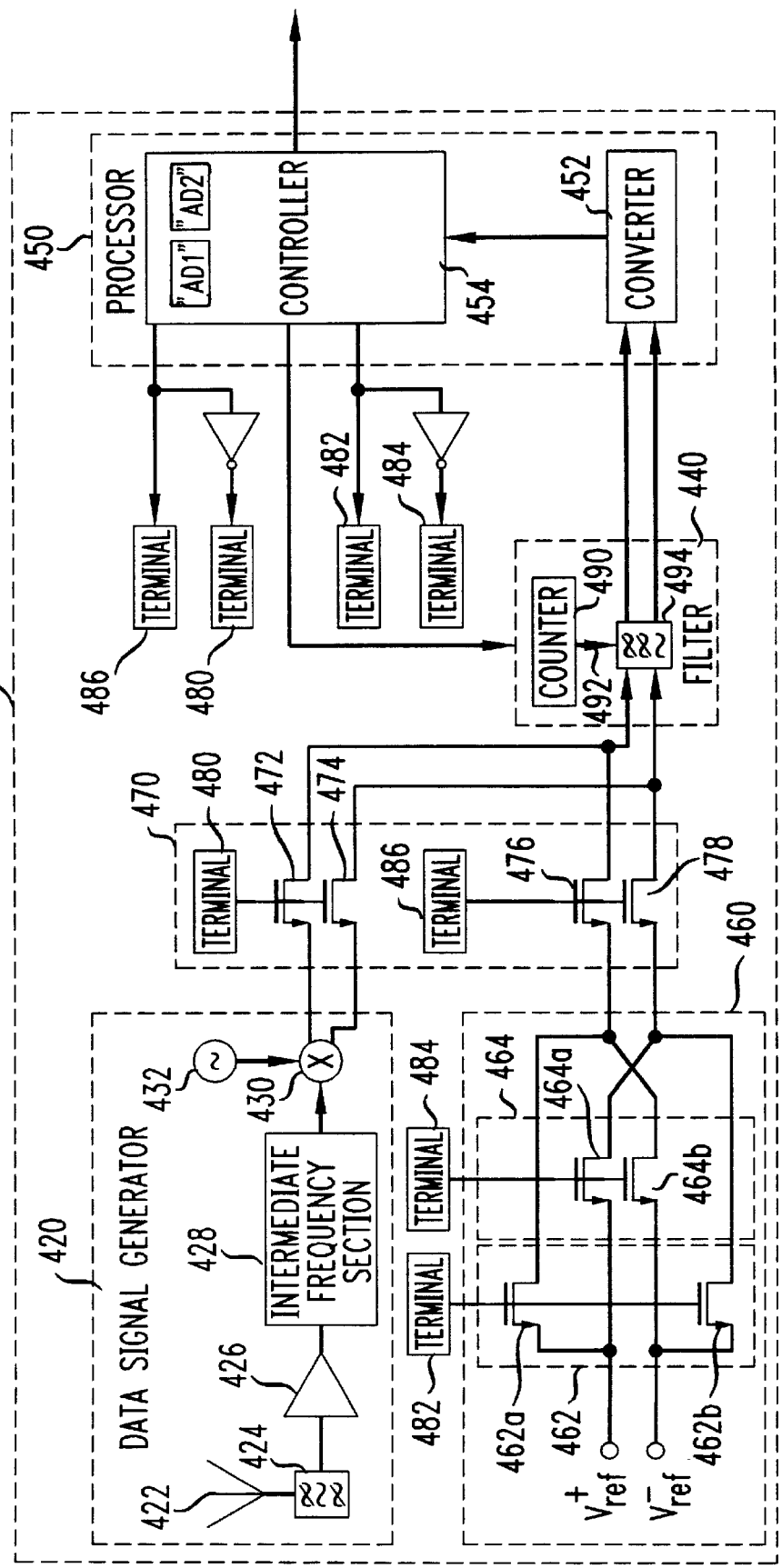
FIG. 6 is a schematic of a second circuit incorporating an off-line filter tuning technique in accordance with the present invention.

FIG. 6 shows an alternative circuit 410 which employs the tuning of a continuous-time filter in accordance with the present invention. Circuit 410 includes a data signal generator 420, a filter 440, a signal processor 450, a test signal generator 460, and a quad-switch 470.

The data signal generator 420 includes an antenna 422, a bandpass filter 424, an amplifier 426, an intermediate frequency section 428, a mixer 430, and a local oscillator 432. The filter 440 includes a counter 490 connected by a control bus 492 to a filter portion 494. These components are numbered similarly to their counterparts in FIG. 2 and have the identical purpose except that mixer 430 is specifically shown as having differential outputs.

A quad-switch 470 is provided which is comprised of partial switches 472, 474, 476, and 478. The quad-switch 470 functions to connect/disconnect the data signal generator 420 and the test signal generator 460 from the transmission input of the filter 440. Partial switches 472 and 474 connect the high and low outputs of mixer 430, respectively, with the high and low transmission inputs of filter 440 during a data phase of operation, and partial switches 476 and 478 connect the high and low outputs of test signal generator 460 to the high and low transmission inputs of the filter 440 during a tuning phase of operation.

The test signal generator 460 includes two dual switches 462 and 464. Dual switch 462 includes partial switches 462a and 462b and dual switch 464 includes partial switches 464a and 464b. Each partial switch is preferably a MOSFET transistor.

The signal processor 450 includes analog to digital converter 452 and a controller 454. These components serve the identical purpose as their counterparts in FIG. 2, except that differential outputs and inputs are specifically shown.

Figure 7A:
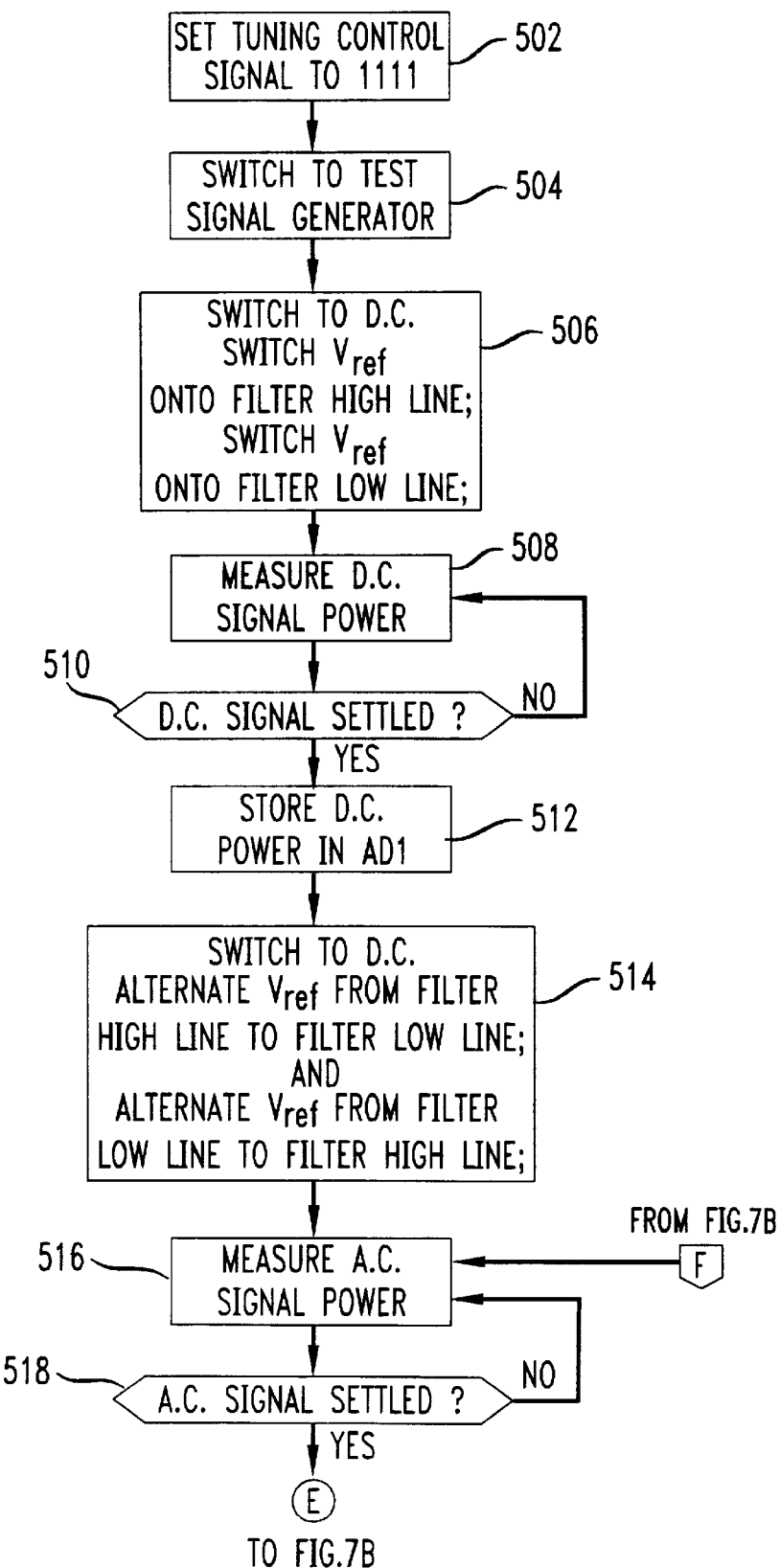
FIGS. 7A and 7B together show a flow chart of the tuning operation of the present invention for use with the circuit of FIG. 6.
Figure 7B:
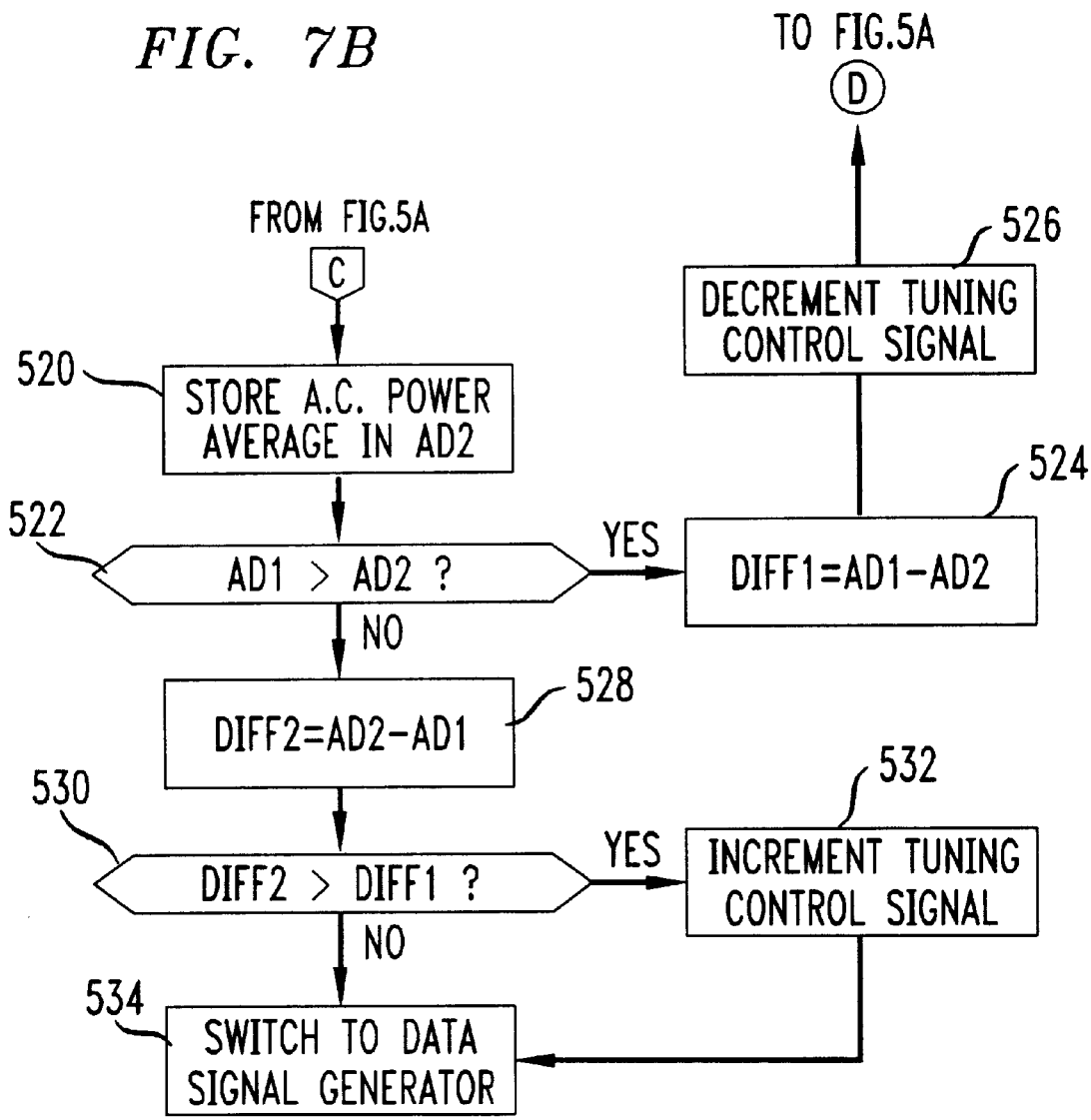

The tuning operation of the circuit 410 of FIG. 6 will be described with reference to flow chart 500 of FIGS. 7A and 7B. A digital tuning control signal is set to 1111 in the counter 490 of the filter 440 at step 502. At step 504 the controller 454 deactivates partial switches 472 and 474 of quad-switch 470 through terminal 480 and activates partial switches 476 and 478 of quad-switch 470 through terminal 486 to disconnect the data signal generator 420 and to connect the test signal generator 460 to the transmission input of the low pass filter 440.

At step 506, the controller 454 switches to a D.C. source by activating partial switches 462a and 462b of dual switch 462 through terminal 482 and deactivating partial switches 464a and 464b of dual switch 464 through terminal 484. Terminal 482 may merely be an inverted version of terminal 484. This switches the $V_{ref}^+$ source onto the high line and the $V_{ref}^-$ source onto the low line of the transmission input of the filter, creating an effective D.C. input of $+/-(V_{ref}^+ - V_{ref}^-)$.

As explained in the previous section, with reference to the controller 54 of FIG. 2, the controller 454 makes sure that the output of the filter is well settled prior to the final measurements. At step 508 the D.C. signal power is measured and then it is determined at step 510 whether the D.C. signal is settled. If the D.C. signal has not settled the D.C. signal power is measured repeatedly at step 508, until the D.C. signal is settled.

When the D.C. signal has settled, the amplitude of the signal at the transmission output of the filter 440 is taken and squared at step 512, to obtain a D.C. power value which is stored in register AD1 of the controller 454. For the D.C. power measurement we have chosen to store the sum of 13 power readings. The reason for multiple readings is first to average out spurious random noise. As will be explained later, this also helps eliminate the need to multiply or divide.

At step 514 an A.C. source is provided by controller 454 activating partial switches 462a and 462b of dual switch 462 through terminal 482 and deactivating partial switches 464a and 464b of dual switch 464 through terminal 484 during a first period. This connects $V_{ref}^+$ and $V_{ref}^-$ with the high line and the low line, respectively, of the transmission input of the filter 440. During a second period, controller 454 deactivates partial switches 462a and 462b of dual switch 462 through terminal 482 and activates partial switches 464a and 464b of dual switch 464 through terminal 484, connecting the voltage references in an opposite manner. $V_{ref}^-$ and $V_{ref}^+$ are now connected to the high line and the low lines, respectively, of the transmission input of the filter 440.

Notice that the A.C. signal at the input of the filter 440 is a square wave instead of a sinusoidal wave. Since a square waveform comprises a sinusoidal signal at the fundamental frequency plus odd harmonics, the filtering characteristic of the filter 440 to be tuned will attenuate the harmonics. The level of attenuation depends on the order of the filter. Here we are assuming that the filter 440 provides enough attenuation for the harmonics so that it does not affect the accuracy of the tuning. The square wave of the above embodiment is much easier to generate than a sinusoid and can be generated with no extra hardware. While a square wave is comprised of a desired signal and undesirable harmonics, the filter 440 which is provided significantly reduces the undesirable harmonics. In cases where the harmonics cause problems, the A.C. tuning source could also be generated from a stored waveform in a read-only-memory (ROM) table in the controller 454. The waveform would be stored in a digital form and converted to an analog sinusoidal signal. This switching technique allows an A.C. and D.C. source to be provided from the same voltage source, and allows the A.C. and D.C. amplitude to be related to each other. The switches can be alternated during the A.C. phase of operation at the clock frequency of the oscillator inside the controller 454.

At step 516 the A.C. signal power is measured by the controller 454 and at step 518 it is determined whether the A.C. signal has settled. If not, the A.C. signal power is repeatedly measured at step 516, until the A.C. signal has settled.

When the A.C. signal has settled, at step 520, during the A.C. phase of operation, thirty-two consecutive samples of the amplitude of a signal from the transmission output of the filter 440 are taken over two cycles, and each sample is squared. The squared samples are summed to form the A.C. average power value in the controller 454. This value is stored in AD2. Although the controller 454 performs these measurements to determine an A.C. average power value for comparison with the D.C. power value, these measurements can also be used to determine if the A.C. signal at the output of the filter 440 has settled. Next the controller 454 compares the value stored in AD1 with the value stored in AD2 at step 522. Note that thirty-two samples of the A.C. signal are compared with thirteen samples of the D.C. signal. The ratio of the number of D.C. and A.C. samples chosen is based on the fact that the peak-to-peak amplitude of the square waveform is double the D.C. voltage and the peak amplitude of the fundamental sinusoid is a factor of 4/pi times larger than the square wave.

If the D.C. value happens to be larger than the A.C. value, the D.C. value minus the A.C. value is stored in a register named DIFF1 in the controller 454, at step 524, and the tuning control signal is decremented, at step 526. Then the loop starting with step 516, i.e. measuring of A.C. signal power, is repeated until the A.C. value in AD2 gets larger than the D.C. value in AD1. Once the A.C. value stored in AD2 gets to be larger than the D.C. value in AD1, the current difference between the two values is saved in a register named DIFF2, in the controller 454, at step 528. Next, the contents of DIFF1 and DIFF2 are compared at step 530. If DIFF2 happens to be the larger of the two, the tuning control signal is incremented, at step 532, to account for over tuning.

In the case where DIFF2 is smaller than DIFF1, no correction is needed. The tuning cycle is completed at this point and the controller 454 can be freed up to get to its normal tasks. The controller 454 switches back to normal data operation at step 534 by activating partial switches 472 and 474 of quad-switch 470 through terminal 480 and deactivating switches 476 and 478 of quad-switch 470 through terminal 486.

The present invention is particularly useful for filters used in wireless systems. The A.C. tuning source of the present invention can be generated from a timer function available in a conventional controller. The D.C. tuning source can be derived from the voltage reference used for conventional analog to digital converters. Furthermore, the controller can use a "binary search" method instead of a "linear search" described above. That is, the controller can decrease or increase the tuning control signal, which is preferably stored in a counter, by more than one step at a time.

If the tuning technique is used for a filter in a wireless communication device the filter can be fine tuned at the outset of each phone call. After the filter is tuned the first time, it can be fine tuned afterwards and it is not necessary to start the tuning control signal at a value of binary 1111. That is the controller can increase or decrease the counter value from its current value. The tuning method accounts for aging and temperature change and can be done in a fraction of a millisecond.

The present invention can be used where accurate phase response is needed as in phase splitters. In some cases where high accuracy is important, one may need an additional offset cancellation routine for the filter.

We claim:

1. A circuit for tuning frequency response characteristics of a filter means comprising:

the filter means;

means for providing a first test signal comprised of a first test signal component having a first frequency to the filter means;

a first controller coupled to the filter means which measures a first response of the filter means to the first test signal component;

means for providing a second test signal comprised of a second test signal component having a second frequency to the filter means;

wherein the first frequency is substantially different from the second frequency;

the first controller measuring a second response of the filter means to the second test signal component; and the first controller comparing the first response to the second response, determining a tuning control signal based on the comparison, and sending the tuning control signal to the filter means to tune the frequency response characteristics of the filter means.

2. The circuit of claim 1 wherein the means for providing the first test signal comprises an alternating signal source and the first test signal component is an alternating signal; and the means for providing the second test signal comprises a direct signal sources, the second test signal component is a direct signal, and the second frequency is zero.

3. A cellular device comprising:

a filter means;

means for providing a first test signal comprised of a first test signal component having a first frequency to the filter means;

a first controller coupled to the filter means which measures a first response of the filter means to the first test signal component;

means for providing a second test signal comprised of a second test signal component having a second frequency to the filter means;

wherein the first frequency is substantially different from the second frequency;

the first controller measuring a second response of the filter means to the second test signal component, and the first controller comparing the first response to the second response, determining a tuning control signal based on the comparison, and sending the tuning control signal to the filter means to tune frequency response characteristics of the filter means.

4. The cellular device of claim 3 wherein the means for providing the first test signal comprises an alternating signal source and the first test signal component is an alternating signal; and the means for providing the second test signal comprises a direct signal sources, the second test signal component is a direct signal, and the second frequency is zero.

5. A circuit for filtering a data signal comprising:

a test signal generator having an output, the test signal generator comprised of a first test signal source and a second test signal source, the first test signal source producing a first test signal comprised of a first test signal component having a first frequency, the second test signal source producing a second test signal comprised of a second test signal component having a second frequency, wherein the first frequency is substantially different from the second frequency;

a data signal generator having an output;

a filter having a transmission input, a transmission output and a control input;

a first switch;

a signal processor having a transmission input connected to the transmission output of the filter, a first control output connected to the control input of the filter, and a second control output connected to the first switch;

wherein the signal processor provides a tuning control signal to the control input of the filter for setting frequency response characteristics of the filter in response to a first filtered signal and a second filtered signal from the transmission output of the filter during a tuning phase;

wherein the first switch:

connects the output of the test signal generator to the transmission input of the filter and disconnects the output of the data signal generator from the transmission input of the filter in response to a first control signal from the signal processor during a tuning phase; and connects the output of the data signal generator to the transmission input of the filter and disconnects the test signal generator from the transmission input of the filter in response to a second control signal from the signal processor to during a data phase; and a second switch having a control input connected to the signal processor, wherein the second switch:

connects the first test signal source and disconnects the second test signal source from the transmission input of the filter in response to a third control signal from the signal processor during a first test signal phase, and connects the second signal source and disconnects the first test signal source from the transmission input of the filter in response to a fourth control signal from the signal processor during a second test signal phase;

wherein the signal processor compares:

the first filtered signal produced due to the first test signal component at the transmission output of the filter during the first test signal phase with the second filtered signal produced due to the second test signal component at the transmission output of the filter during the second test signal phase;

and the signal processor produces the tuning control signal based on the comparison.

6. The circuit of claim 5 wherein the first test signal source is comprised of a direct signal source, the first test signal component is a direct signal, the first frequency is zero, and the first test signal phase is a direct signal phase;

the second test signal source is comprised of an alternating signal source, the second test signal component is an alternating signal, and the second test signal phase is an alternating signal phase.

7. The circuit of claim 6;
wherein the transmission input of the filter is comprised of differential inputs which are comprised of a first terminal and a second terminal;

the output of the data signal generator is comprised of differential outputs which are comprised of a first output terminal and a second output terminal; and the output of the test signal generator is comprised of differential outputs, which are comprised of a first output terminal and a second output terminal;

and wherein the first switch is quad-switch comprised of first, second, third, and fourth partial switches and, the first and second partial switches of the first switch connect the data signal generator second and first output terminals to the filter second and first terminals, respectively, in response to the second control signal from the signal processor during a data phase, and disconnect the data signal generator second and first output terminals from the filter second and first terminals, respectively, in response to the first control signal from the signal processor during a tuning phase;

the third and fourth partial switches of the first switch disconnect the test signal generator second and first output terminals from the filter second and first terminals, respectively, in response to the second control signal from the signal processor during a data phase and connect the test signal generator second and first output terminals to the filter second and first terminals, respectively, in response to the first control signal from the signal processor to during a tuning phase;

wherein the test signal generator is further comprised of:

a high voltage reference and a low voltage reference, a first dual switch and a second dual switch, each dual switch comprised of first and second partial switches, the first and second partial switches of the first dual switch connecting the high and low voltage references to the second and first terminals, respectively of the transmission input of the filter in response to a fifth control signal from the signal processor during a direct signal phase, and the first and second partial switches of the second dual switch disconnecting the high and low voltage references from the first and second terminals, respectively of the transmission input of the filter in response to a sixth control signal from the signal processor during a direct signal phase;

the first and second partial switches of the first dual switch alternately connecting and disconnecting the high and low voltage references to and from the second and first terminals, respectively, of the transmission input of the filter in response to an alternating control signal from the signal processor during an alternating signal phase, and the first and second partial switches of the second dual switch alternately disconnecting and connecting the high and low voltage references to and from the first and second terminals, respectively, of the transmission input of the filter in response to an inverse alternating control signal from the signal processor during the alternating signal phase.

8. The circuit of claim 5 wherein the filter is comprised of:
at least one variable capacitance circuit which determines the frequency response characteristics of the filter, the variable capacitance circuit connected to the control input of the filter, the capacitance of the variable capacitance circuit determined at least in part by the tuning control signal.

9. The circuit of claim 6 wherein the filter is comprised of:
at least one variable capacitance circuit which determines the frequency response characteristics of the filter, the variable capacitance circuit connected to the control input of the filter, the capacitance of the variable capacitance circuit determined at least in part by the tuning control signal.

10. The circuit of claim 7 wherein the filter is comprised of:
at least one variable capacitance circuit which determines the frequency response characteristics of the filter, the variable capacitance circuit connected to the control input of the filter, the capacitance of the variable capacitance circuit determined at least in part by the tuning control signal.

11. The circuit of claim 8 wherein the filter is comprised of:
a fixed capacitance circuit connected in parallel with the variable capacitance circuit.

12. The circuit of claim 9 wherein the filter is comprised of:
a fixed capacitance circuit connected in parallel with the variable capacitance circuit.

13. The circuit of claim 8 wherein the filter is comprised of:
a fixed capacitance circuit connected in parallel with the variable capacitance circuit.

14. The circuit of claim 5 wherein the signal processor is comprised of:
an analog to digital converter having an input connected to the transmission output of the filter and an output; and a controller having an input connected to the output of the analog to digital converter, and an output connected to the control input of the filter, wherein the controller provides the tuning control signal as a digital signal to the control input of the filter in response to a signal from the transmission output of the filter during the tuning phase.

15. The circuit of claim 6 wherein the signal processor is comprised of:
an analog to digital converter having an input connected to the transmission output of the filter and an output; and a controller having an input connected to the output of the analog to digital converter, and an output connected to the control input of the filter, wherein the controller provides the tuning control signal as a digital signal to the control input of the filter in response to a signal from the transmission output of the filter during the tuning phase.

16. The circuit of claim 7 wherein the signal processor is comprised of:
an analog to digital converter having an input connected to the transmission output of the filter and an output; and a controller having an input connected to the output of the analog to digital converter, and an output connected to the control input of the filter, wherein the controller provides the tuning control signal as a digital signal to the control input of the filter in response to a signal from the transmission output of the filter during the tuning phase.

17. The circuit of claim 8 wherein the signal processor is comprised of:
an analog to digital converter having an input connected to the transmission output of the filter and an output; and
a controller having an input connected to the output of the analog to digital converter, and an output connected to the control input of the filter, wherein the controller provides the tuning control signal as a digital signal to the control input of the filter in response to a signal from the transmission output of the filter during the tuning phase.

18. The circuit of claim 9 wherein the signal processor is comprised of:
an analog to digital converter having an input connected to the transmission output of the filter and an output; and
a controller having an input connected to the output of the analog to digital converters and an output connected to the control input of the filter, wherein the controller provides the tuning control signal as a digital signal to the control input of the filter in response to a signal from the transmission output of the filter during the tuning phase.

19. The circuit of claim 10 wherein the signal processor is comprised of:
an analog to digital converter having an input connected to the transmission output of the filter and an output; and
a controller having an input connected to the output of the analog to digital converter, and an output connected to the control input of the filter, wherein the controller provides the tuning control signal as a digital signal to the control input of the filter in response to a signal from the transmission output of the filter during the tuning phase.

20. The circuit of claim 6 wherein the alternating signal source is a square wave generator.

21. The circuit of claim 9 wherein the alternating signal source is a square wave generator.

22. The circuit of claim 15 wherein the alternating signal source is a square wave generator.

23. The circuit of claim 17 wherein the data signal generator comprises:
an antenna having an input and an output,
a bandpass filter having an input and an output, the input connected to the output of the antenna,
an amplifier having an input and an output, the input connected to the output of the bandpass filter,
an intermediate frequency stage, having an input and an output, the input connected to the output of the amplifier,
an oscillator having an output, and a
a mixer having an first input connected to the output of the oscillator, a second input connected the output of the intermediate frequency stage, and having an output which is the output of the data signal generator.

24. The circuit of claim 18 wherein the data signal generator comprises:
an antenna having an input and an output,
a bandpass filter having an input and an output, the input connected to the output of the antenna,
an amplifier having an input and an output, the input connected to the output of the bandpass filter,
an intermediate frequency stage, having an input and an output, the input connected to the output of the amplifier,
an oscillator having an output, and a
a mixer having an first input connected to the output of the oscillator, a second input connected the output of the intermediate frequency stage, and having an output which is the output of the data signal generator.

25. The circuit of claim 17 wherein the filter is a low pass filter.

26. The circuit of claim 18 wherein the filter is a low pass filter.

27. The circuit of claim 17 wherein the filter is a high pass filter.

28. The circuit of claim 18 wherein the filter is a high pass filter.

29. The circuit of claim 17 wherein the filter is a band pass filter.

30. The circuit of claim 18 wherein the filter is a band pass filter.

31. The circuit of claim 17 wherein the filter is a fourth order low pass filter comprised of four integrators, each integrator including a variable capacitance circuit.

32. The circuit of claim 18 wherein the filter is a fourth order low pass filter comprised of four integrators, each integrator including a variable capacitance circuit.

33. A method for tuning the frequency response characteristics of a filter comprising:
providing a first test signal comprised of a first test signal component having a first frequency to the filter;
measuring a first response of the filter to the first test signal component;
providing a second test signal comprised of a second test signal component having a second frequency to the filter;
wherein the first frequency is substantially different from the second frequency;
measuring a second response of the filter to the second test signal component;
comparing the first response to the second response;
determining a tuning control signal based on the comparison; and
sending the tuning control signal to the filter to tune the frequency response characteristics of the filter.

34. The method of claim 33 wherein
the step of providing the first test signal comprises providing an alternating signal and the first test signal component is an alternating signal; and
the step of providing the second test signal comprises providing a direct signal and the second test signal component is a direct signal.

35. A method of tuning the frequency response characteristics of a continuous-time filter comprising:
disconnecting a data signal generator from a transmission input of a filter during a tuning phase;
connecting a test signal generator to the transmission input of the filter during the tuning phase;
wherein the test signal generator comprises a first test signal source producing a first test signal comprised of a first test signal component having a first frequency and a second test signal source producing a second test signal comprised of a second test signal component having a second frequency, wherein the first frequency is substantially different from the second frequency;

the step of connecting the test signal generator comprising:
  connecting the first test signal source during a first test signal phase and connecting the second test signal source during a second test signal phase;
producing a tuning control signal by the followings steps:
  during a first test signal filter settling loop:
    obtaining two first test signal samples, at least one of which is new, of a signal produced due to the first test signal component at the transmission output of the filter during the first test signal phase,
    comparing the two first test signal samples with each other,
    and repeating the above steps of the first test signal filter settling loop until the comparison of the two first test signal samples satisfies a criteria,
  during a second test signal filter settling loop:
    obtaining two second test signal samples, at least one of which is new, of a signal produced due to the second test signal component at the transmission output of the filter during the second test signal phase,
    comparing the two second test signal samples with each other,
    and repeating the above steps of the second test signal filter settling loop until the comparison of the two second test signal samples satisfies a criteria; and
  comparing a signal produced due to the first test signal component at the transmission output of the filter during the first test signal phase with a signal produced due to the second test signal component at the transmission output of the filter during the second test signal phase, and producing a tuning control signal based on that comparison;
applying the tuning control signal to a control input of the filter to tune its frequency response characteristics.

36. The method of claim 35 wherein the first test signal source is comprised of a direct signal source, the first test signal component is a direct signal, the first frequency is zero, and the first test signal phase is a direct signal phase;
and the second test signal source is comprised of an alternating signal source, the second test signal component is an alternating signal, and the second test signal phase is an alternating signal phase.

37. A cellular device comprising:
a test signal generator having an output, the test signal generator comprised of a first test signal source producing a first test signal comprised of a first test signal component having a first frequency, and a second test signal source producing a second test signal comprised of a second test signal component having a second frequency, wherein the first frequency differs substantially from the second frequency;
a data signal generator having an output;
a filter having a transmission input, a transmission output and a control input;
a first switch;
a signal processor having a transmission input connected to the transmission output of the filter, a first control output connected to the control input of the filter, and a second control output connected to the first switch;
the signal processor providing a tuning control signal to the control input of the filter for setting the filter's frequency response characteristics in response to a signal from the transmission output of the filter during a tuning phase;

the first switch:
  connecting the output of the test signal generator to the transmission input of the filter and disconnecting the output of the data signal generator from the transmission input of the filter in response to a first control signal from the signal processor during a tuning phase; and
  connecting the output of the data signal generator to the transmission input of the filter and disconnecting the test signal generator from the transmission input of the filter in response to a second control signal from the signal processor to during a data phase and further comprised of a second switch:
having a control input connected to the signal processor and:
  connecting the first test signal source and disconnecting the second test signal source from the transmission input of the filter in response to a third control signal from the signal processor during a first test signal phase, and
  connecting the second test signal source and disconnecting the first test signal source from the transmission input of the filter in response to a fourth control signal from the signal processor during an second test signal phase;
wherein the signal processor compares:
  a signal produced due to the first test signal component at the transmission output of the filter during the first test signal phase with
  a signal produced due to the second test signal component at the transmission output of the filter during the second test signal phase;
  and the signal processor produces the tuning control signal based on the comparison the tuning control signal used for tuning the frequency response characteristics of the filter.

38. The cellular device of claim 37 wherein
the first test signal generator is comprised of a direct signal source, the first test signal component is a direct signal, the first frequency is zero, and the first test signal phase is a direct signal phase; and
the second test signal generator is comprised of an alternating signal source, the second test signal component is an alternating signal, and the second test signal phase is an alternating signal phase.

39. A method of tuning frequency response characteristics of a continuous-time filter comprising:
disconnecting a data signal generator from a transmission input of a filter during a tuning phase;
connecting a test signal generator to the transmission input of the filter during the tuning phase;
wherein the test signal generator comprises a first test signal source producing a first test signal comprised of a first test signal component having a first frequency and a second test signal source producing a second test signal comprised of a second test signal component having a second frequency, wherein the first frequency differs substantially from the second frequency and;
wherein the step of connecting the test signal generator to the transmission input of the filter comprises:
  connecting the first test signal source and disconnecting the second test signal source during a first test signal phase;
  connecting the second test signal source and disconnecting the first test signal source during a second test signal phase;

comparing a signal produced due to the first test signal component at the transmission output of the filter during the first test signal phase with a signal produced due to the second test signal component at the transmission output of the filter during the second test signal phase, and producing a tuning control signal based on the comparison, the tuning control signal used for tuning the frequency response characteristics of the filter.

40. The method of claim 39 wherein:

the first test signal source is a direct signal source, the first test signal component is a direct signal, the first frequency is zero, and the first test signal phase is a direct signal phase; and the second test signal source is a alternating signal source, the second test signal component is an alternating signal, and the second test signal phase is an alternating signal phase.

41. The method of claim 40 further comprising the steps of:

comparing a signal produced at the transmission output of the filter, after the tuning control signal is applied, during the alternating signal phase, with a signal produced at the transmission output of the filter during the direct signal phase, and iteratively updating the tuning control signal and applying the updated tuning control signal to the filter until a signal produced at the transmission output of the filter during the alternating signal phase satisfies a particular mathematical relationship with regard to a signal produced at the transmission output of the filter during the direct signal phase.

42. The method of claim 40 wherein the step of connecting the direct signal source comprises:

connecting a voltage reference of a first polarity to a high line of the transmission input of the filter;

connecting a voltage reference of a second polarity which is opposite of the first polarity to a low line of the transmission input of the filter;

and wherein the step of connecting the alternating signal source during the alternating signal phase comprises:

alternately connecting the voltage reference of the first polarity to the high line of the transmission input of the filter and then to the low line of the transmission input of the filter and;

alternately connecting the voltage reference of the second polarity to the low line of the transmission input of the filter and then to the high line of the transmission input of the filter, wherein the two voltage references are connected to opposite lines of the filter.

43. The method of claim 40 wherein the step of applying the tuning control signal to the control input of the filter to tune its frequency response characteristics comprises:

applying the tuning control signal to a variable capacitance circuit to change the capacitance of the circuit.

44. The method of claim 41 wherein the step of applying the tuning control signal to the control input of the filter to tune its frequency response characteristics comprises:

applying the tuning control signal to a variable capacitance circuit to change the capacitance of the circuit.

45. The method of claim 42 wherein the step of applying the tuning control signal to the control input of the filter to tune its frequency response characteristics comprises:

applying the tuning control signal to a variable capacitance circuit to change the capacitance of the circuit.

46. The method of claim 43 and wherein the tuning control signal is a digital signal.

47. The method of claim 44 and wherein the tuning control signal is a digital signal.

48. The method of claim 45 and wherein the tuning control signal is a digital signal.

49. The method of claim 46 wherein the step of comparing a signal produced at the transmission output of the filter during the direct signal phase with a signal produced at the transmission output of the filter during the alternating signal phase comprises:

determining a power value of a signal produced at the transmission output of the filter during the alternating signal phase;

determining a power value of a signal produced at the transmission output of the filter during the direct signal phase; and comparing the power value due to the alternating signal phase with the power value due to the direct signal phase.

50. The method of claim 49 further comprising the step of:

iteratively updating the tuning control signal and applying the updated tuning control signal to the filter until the power value due to the alternating signal phase satisfies a particular mathematical relationship with regard to the power value due to the direct signal phase.

51. The method of claim 50 wherein the tuning control signal is iteratively updated by incrementing or decrementing the tuning control signal.

52. The method of claim 47 wherein the step of comparing a signal produced at the transmission output of the filter during the direct signal phase with a signal produced at the transmission output of the filter during the alternating signal phase comprises:

determining a power value of a signal produced at the transmission output of the filter during the alternating signal phase;

determining a power value of a signal produced at the transmission output of the filter during the direct signal phase; and comparing the power value due to the alternating signal phase with the power value due to the direct signal phase.

53. The method of claim 48 wherein the step of comparing a signal produced at the transmission output of the filter during the direct signal phase with a signal produced at the transmission output of the filter during the alternating signal phase comprises:

determining a power value of a signal produced at the transmission output of the filter during the alternating signal phase;

determining a power value of a signal produced at the transmission output of the filter during the direct signal phase; and comparing the power value due to the alternating signal phase with the power value due to the direct signal phase.

54. The method of claim 41 wherein the tuning control signal is updated until the following particular mathematical relationship is satisfied:

the tuning control signal is updated until the average power of the signal produced at the transmission output of the filter during the alternating signal phase is greater than the average power of the signal produced at the transmission output of the filter during the direct signal phase.

\* \* \* \* \*